(12) United States Patent
Cropper et al.

(10) Patent No.: US 10,658,969 B2
(45) Date of Patent: May 19, 2020

(54) PHOTOVOLTAIC SOLAR ROOF TILE ASSEMBLY

(71) Applicant: Solarmass Energy Group Ltd., Vancouver, BC (CA)

(72) Inventors: Paul Julian Cropper, Vancouver (CA); David Allan Stirling, Vancouver (CA)

(73) Assignee: SOLARMASS ENERGY GROUP LTD., Vancouver, BC (CA)

( * ) Notice: Subject to any disclaimer, the term of this patent is extended or adjusted under 35 U.S.C. 154(b) by 0 days.

(21) Appl. No.: 16/292,557

(22) Filed: Mar. 5, 2019

(65) Prior Publication Data

US 2019/0199274 A1 Jun. 27, 2019

Related U.S. Application Data

(63) Continuation of application No. 14/560,805, filed on Dec. 4, 2014.

(51) Int. Cl.
| | | |
|---|---|---|
| H02S 20/25 | (2014.01) |
| H01L 31/048 | (2014.01) |
| H01L 31/02 | (2006.01) |
| H01L 31/049 | (2014.01) |
| H01L 31/044 | (2014.01) |
| H02S 40/34 | (2014.01) |

(Continued)

(52) U.S. Cl.
CPC ........ *H02S 20/25* (2014.12); *H01L 31/02021* (2013.01); *H01L 31/044* (2014.12); *H01L 31/048* (2013.01); *H01L 31/049* (2014.12); *H02S 40/34* (2014.12); *H02S 40/36* (2014.12); *F24S 2020/13* (2018.05); *Y02B 10/12* (2013.01); *Y02E 10/50* (2013.01)

(58) Field of Classification Search
CPC .......... H02S 20/23; H02S 20/24; H02S 20/25; H02S 40/34; H02S 40/36; H01L 31/048
See application file for complete search history.

(56) References Cited

U.S. PATENT DOCUMENTS

| | | |
|---|---|---|
| 3,774,428 A | 11/1973 | Derry |
| 4,288,959 A | 9/1981 | Murdock |
| 4,498,267 A | 2/1985 | Beck |

(Continued)

FOREIGN PATENT DOCUMENTS

| | | |
|---|---|---|
| CN | 201893358 | 7/2011 |
| EP | 2169727 | 10/2010 |

(Continued)

*Primary Examiner* — Lindsey A Bernier
(74) *Attorney, Agent, or Firm* — Clark & Brody LP

(57) ABSTRACT

A method of manufacture of a photovoltaic solar roof tile assembly can include forming a laminated structure by laminating one or more sheets that include at least one photovoltaic solar cell, and attaching a junction box to the laminated structure to form a photovoltaic solar panel. The junction box can include a first DC connector and a second DC connector. Attaching the junction box to the laminated structure can include sealing the first DC connector to the laminated structure. The method of manufacture can include forming a roof tile with a hole that extends from a front side of the roof tile to a rear side of the roof tile, and locating the junction box in the hole by inserting the first DC connector from a front side of the roof tile and attaching the second DC connector from the rear side.

6 Claims, 13 Drawing Sheets

(51) Int. Cl.
*H02S 40/36* (2014.01)
*F24S 20/00* (2018.01)

(56) References Cited

U.S. PATENT DOCUMENTS

| | | |
|---|---|---|
| 4,582,953 A | 4/1986 | Nagase |
| 5,776,262 A | 7/1998 | Melchior |
| 5,986,203 A | 11/1999 | Hanoka et al. |
| 5,990,414 A | 11/1999 | Posnansky |
| 6,294,724 B1 | 9/2001 | Sasaoka |
| 6,307,144 B1 | 10/2001 | Mimura |
| 6,360,497 B1 | 3/2002 | Nakazima |
| 6,453,629 B1 | 9/2002 | Nakazima |
| 7,442,872 B2 | 10/2008 | Umemoto |
| 7,718,288 B2 | 5/2010 | Murphy et al. |
| 8,168,880 B2 | 5/2012 | Jacobs |
| 8,522,493 B1 | 9/2013 | Rogers |
| 9,800,053 B2 | 10/2017 | Beitel et al. |
| 2002/0043277 A1 | 4/2002 | Yamawaki |
| 2004/0187909 A1 | 9/2004 | Sato |
| 2005/0076948 A1 | 4/2005 | Komamine |
| 2005/0141153 A1 | 6/2005 | Mucci |
| 2005/0178430 A1 | 8/2005 | McCaskill |
| 2005/0252140 A1 | 11/2005 | Faulkner |
| 2007/0181174 A1 | 8/2007 | Ressler |
| 2007/0227583 A1 | 10/2007 | Davies |
| 2008/0000174 A1 | 1/2008 | Flaherty |
| 2008/0000512 A1 | 1/2008 | Flaherty |
| 2008/0041434 A1 | 2/2008 | Adriani |
| 2008/0110490 A1 | 5/2008 | Duesterhoeft |
| 2008/0115911 A1 | 5/2008 | Duesterhoeft |
| 2008/0135094 A1* | 6/2008 | Corrales ............... H01L 31/052 136/259 |
| 2008/0160819 A1* | 7/2008 | Daily ................ H01R 13/6272 439/358 |
| 2008/0289272 A1 | 11/2008 | Flaherty |
| 2008/0289679 A1 | 11/2008 | Ressler |
| 2008/0302030 A1 | 12/2008 | Stancel |
| 2008/0302031 A1 | 12/2008 | Bressler et al. |
| 2008/0302409 A1 | 12/2008 | Bressler |
| 2008/0313976 A1 | 12/2008 | Allen |
| 2009/0000221 A1 | 1/2009 | Jacobs |
| 2009/0126782 A1 | 5/2009 | Krause |
| 2009/0133340 A1 | 5/2009 | Shiao |
| 2009/0133739 A1 | 5/2009 | Shiao |
| 2009/0142945 A1 | 6/2009 | Duesterhoeft |
| 2009/0159118 A1 | 6/2009 | Kalkanoglu |
| 2009/0178350 A1 | 7/2009 | Kalkanoglu |
| 2010/0084003 A1 | 4/2010 | Chen |
| 2010/0101634 A1 | 4/2010 | Frank |
| 2010/0116325 A1 | 5/2010 | Nikoonahad |
| 2010/0170169 A1 | 7/2010 | Railkar |
| 2010/0201493 A1 | 8/2010 | Takano |
| 2010/0212740 A1 | 8/2010 | Barth |
| 2010/0294341 A1 | 11/2010 | Frank |
| 2010/0313499 A1 | 12/2010 | Gangemi |
| 2011/0048504 A1 | 3/2011 | Kinard |
| 2011/0155220 A1 | 6/2011 | Lee |
| 2011/0162290 A1 | 7/2011 | Nightingale |
| 2011/0162301 A1 | 7/2011 | Ueda |
| 2011/0168228 A1 | 7/2011 | McGreevy |
| 2011/0217856 A1 | 9/2011 | Vijh |
| 2012/0085040 A1 | 4/2012 | Ketwitz |
| 2012/0161527 A1 | 6/2012 | Casey |
| 2012/0186630 A1 | 7/2012 | Jenkins |
| 2012/0204927 A1 | 8/2012 | Peterson |
| 2012/0233940 A1 | 9/2012 | Perkins |
| 2012/0240490 A1 | 9/2012 | Gangemi |
| 2012/0272592 A1 | 11/2012 | Bellavia |
| 2012/0291848 A1 | 11/2012 | Sherman |
| 2012/0304559 A1 | 12/2012 | Ishida |
| 2012/0312373 A1 | 12/2012 | Hudson |
| 2013/0003307 A1 | 1/2013 | Jang |
| 2013/0010450 A1 | 1/2013 | Xiao |
| 2013/0012059 A1 | 1/2013 | Xiao |
| 2013/0012060 A1 | 1/2013 | Xiao |
| 2013/0125482 A1 | 5/2013 | Kalkanoglu |
| 2013/0160382 A1 | 6/2013 | Schick |
| 2013/0167898 A1 | 7/2013 | Hong |
| 2013/0169056 A1 | 7/2013 | Sherman |
| 2013/0170149 A1 | 7/2013 | Reese |
| 2013/0180575 A1 | 7/2013 | Jackrel |
| 2013/0212959 A1 | 8/2013 | Lopez |
| 2013/0298958 A1 | 11/2013 | Kopylov |
| 2013/0298970 A1 | 11/2013 | Park |
| 2013/0333303 A1 | 12/2013 | Elisary |
| 2014/0041715 A1* | 2/2014 | Carolan ............... B32B 15/046 136/251 |
| 2014/0196770 A1 | 7/2014 | Jacobs |
| 2014/0332073 A1 | 11/2014 | Chen |
| 2014/0352760 A1 | 12/2014 | Haynes |
| 2014/0366464 A1 | 12/2014 | Rodrigues |
| 2015/0114447 A1 | 4/2015 | Kang |
| 2015/0114955 A1 | 4/2015 | Inaba |
| 2015/0136206 A1 | 5/2015 | Paul |
| 2015/0155822 A1 | 6/2015 | Feng |
| 2015/0354217 A1 | 12/2015 | Lucas |
| 2016/0105142 A1 | 4/2016 | Johansen |
| 2016/0105144 A1 | 4/2016 | Haynes |
| 2016/0105145 A1 | 4/2016 | Drake |
| 2016/0254776 A1 | 9/2016 | Rodrigues |
| 2017/0237390 A1 | 8/2017 | Hudson |
| 2018/0054155 A1 | 2/2018 | Werner |
| 2018/0115275 A1 | 4/2018 | Flanigan |
| 2018/0123504 A1 | 5/2018 | Almy |
| 2018/0183382 A1 | 6/2018 | Hall |
| 2018/0331652 A1 | 11/2018 | Okawa |
| 2018/0351502 A1 | 12/2018 | Almy |
| 2019/0074792 A1 | 3/2019 | Hakenberg |
| 2019/0089299 A1 | 3/2019 | Hakenberg |
| 2019/0123679 A1 | 4/2019 | Rodrigues |
| 2019/0123682 A1 | 4/2019 | Fang |

FOREIGN PATENT DOCUMENTS

| | | | |
|---|---|---|---|
| JP | 06-085306 | 3/1994 | |
| JP | 2005-240274 | 9/2005 | |
| WO | 2012/064288 | 5/2012 | |
| WO | 2012/120489 | 9/2012 | |
| WO | WO-2012120489 A1 * | 9/2012 | ........... B32B 15/046 |

* cited by examiner

PHOTOVOLTAIC SOLAR ROOF TILE ASSEMBLY

This application is a continuation of U.S. Ser. No. 14/560,805 filed on Dec. 4, 2014.

FIELD OF THE INVENTION

The present invention relates to a photovoltaic solar panel.

BACKGROUND OF THE INVENTION

Photovoltaic solar panels are known which absorb solar and ultra violet rays, transforming them into electrical energy.

Referring to FIG. 1 herein, there is illustrated schematically in perspective view an installation comprising a plurality of known solar roof tiles, Integrated into an existing concrete tile roof. Each solar roof tile has a width of approximately 3 concrete roof tiles. To install the solar roof tiles, rows of individual roof tiles are removed, and the solar roof tiles are fitted to the rafters of the roof in place of the concrete roof tiles. Electrical connections to the solar roof tiles are passed through the water proof membrane of the roof, and the electrical connectors at the rear of each roof tile are connected into an electrical circuit within the loft of the roof. Alternatively, the electrical connectors can be connected together on top of the water impermeable membrane, and routed to the edge of the roof, so that a single electrical cable is fitted outside the building down to an electrical junction box at ground level.

Referring to FIG. 2 herein, there is illustrated schematically in detail, part of a solar roof tile as shown in FIG. 1 herein. The solar roof tile comprises a relatively thick sheet of substrate 200, for example made of a plastic sheet, of a thickness similar to the thickness of the adjacent concrete tiles. On top of the plastic substrate, are positioned a plurality of substantially square solar panels 201. On top of the solar panels, is positioned a glass or plastics cover sheet 202, which is held to the plastic substrate by a plurality of external clips 203 around the edges of the clear transparent plastics sheet.

Referring to FIG. 3 herein, there is illustrated schematically in perspective view, a pair of solar tiles as shown in FIGS. 1 and 2.

Referring to FIG. 4 herein, there is illustrated schematically in cross sectional view part of a known photovoltaic solar panel. The solar panel 400 comprises a back sheet 401; first and second encapsulation layers 402, 403; a photovoltaic cell 404; and an ultra-violet resistant glass or plastic screen front sheet 405, which protects the panel against mechanical impact and weathering.

The back sheet portion 401, of the photovoltaic solar panel 400 comprises two surfaces 406, 407, wherein the first surface 406 may be attached to the surface of a roof tile. The second surface of the back sheet portion 407 is adjacent to a first surface 408 of encapsulation layer 402; and a second surface 409 of first encapsulation layer 402 is in adjacent contact with the photovoltaic cell 404. The photovoltaic cell is also in adjacent contact with a first surface 410 of second encapsulation layer 403; and a second surface 411 of second encapsulation layer 403 is in adjacent contact with a first surface 412 of the front sheet 405.

The term "adjacent contact with" does not necessarily mean that the second surface of the encapsulation layer s in contact with a surface of the photovoltaic cell. A layer of encapsulation material may be used between the photovoltaic cell and the back sheet 401 and/or the front sheet 405

Polyethylene terephthalate PET is a known encapsulation material, which is used in solar panels to bond front and back sheets of the panel together by the process of lamination.

Lamination of solar cells with polyethylene-vinyl acetate films is conducted at about 150° C., and permits molten polyethylene-vinyl acetate to flow into voids in a solar panels to encapsulate the solar cell.

The current lifespan of PET solar panels is in the region of 5 to 10 years.

Known photovoltaic panels do not integrate well into the architecture of older, traditional buildings.

SUMMARY OF THE INVENTION

It is an object of the current invention to increase the efficiency and lifespan of current solar panels whilst providing a photovoltaic solar panel which can be easily Integrated into various architectural surroundings.

According to a first aspect of the present invention, there is provided a photovoltaic solar panel for attachment to a roof tile configured with a through aperture, the panel comprising:

a rigid back plate;

a support sheet comprising at least one photovoltaic solar cell;

a negative and a positive connection extending from the or each solar cell through a sealed aperture of the back plate and accessible at the rear of the panel;

a diode connected to the positive connection;

an ultra-violet resistant front sheet for covering a front face of the or each solar cell;

wherein the back plate, support sheet and front sheet form a sealed laminated structure.

Other aspects of are as recited in the claims herein.

BRIEF DESCRIPTION OF THE DRAWINGS

For a better understanding of the invention and to show how the same may be carried into effect, there will now be described by way of example only, specific embodiments, methods and processes according to the present invention with reference to the accompanying drawings in which.

DETAILED DESCRIPTION OF THE EMBODIMENTS

There will now be described by way of example a specific mode contemplated by the inventors. In the following description numerous specific details are set forth in order to provide a thorough understanding. It will be apparent however, to one skilled in the art, that the present invention may be practiced without limitation to these specific details. In other Instances, well known methods and structures have not been described in detail so as not to unnecessarily obscure the description.

There is disclosed herein a novel photovoltaic solar panel designed to be attached to the front face of proprietary concrete, clay, metal or plastic roof tile. The solar panel is capable of generating electricity and thus providing a solar tile. The solar tile may be fitted directly to a roof to form a flat roof surface. The apparatus is designed to fit to new and replacement roofs.

Figure 1:
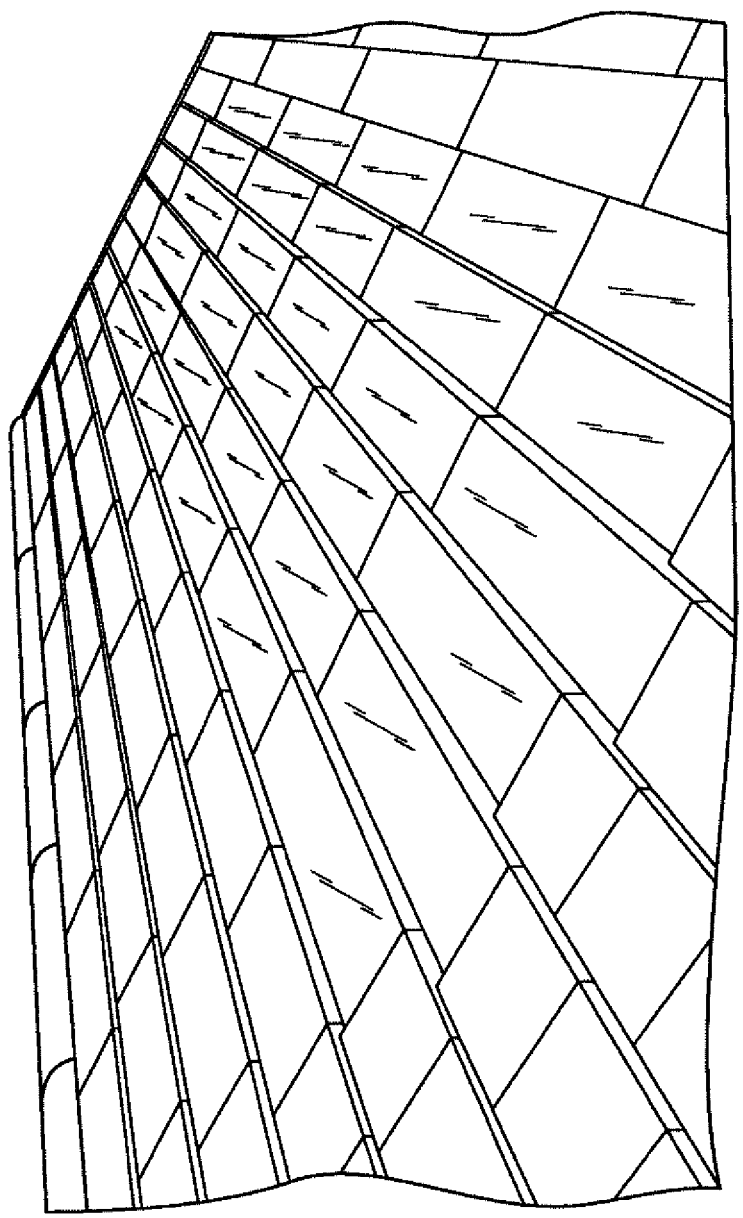
FIG. 1 show schematically a known solar tile in a roof installation.
Figure 2:
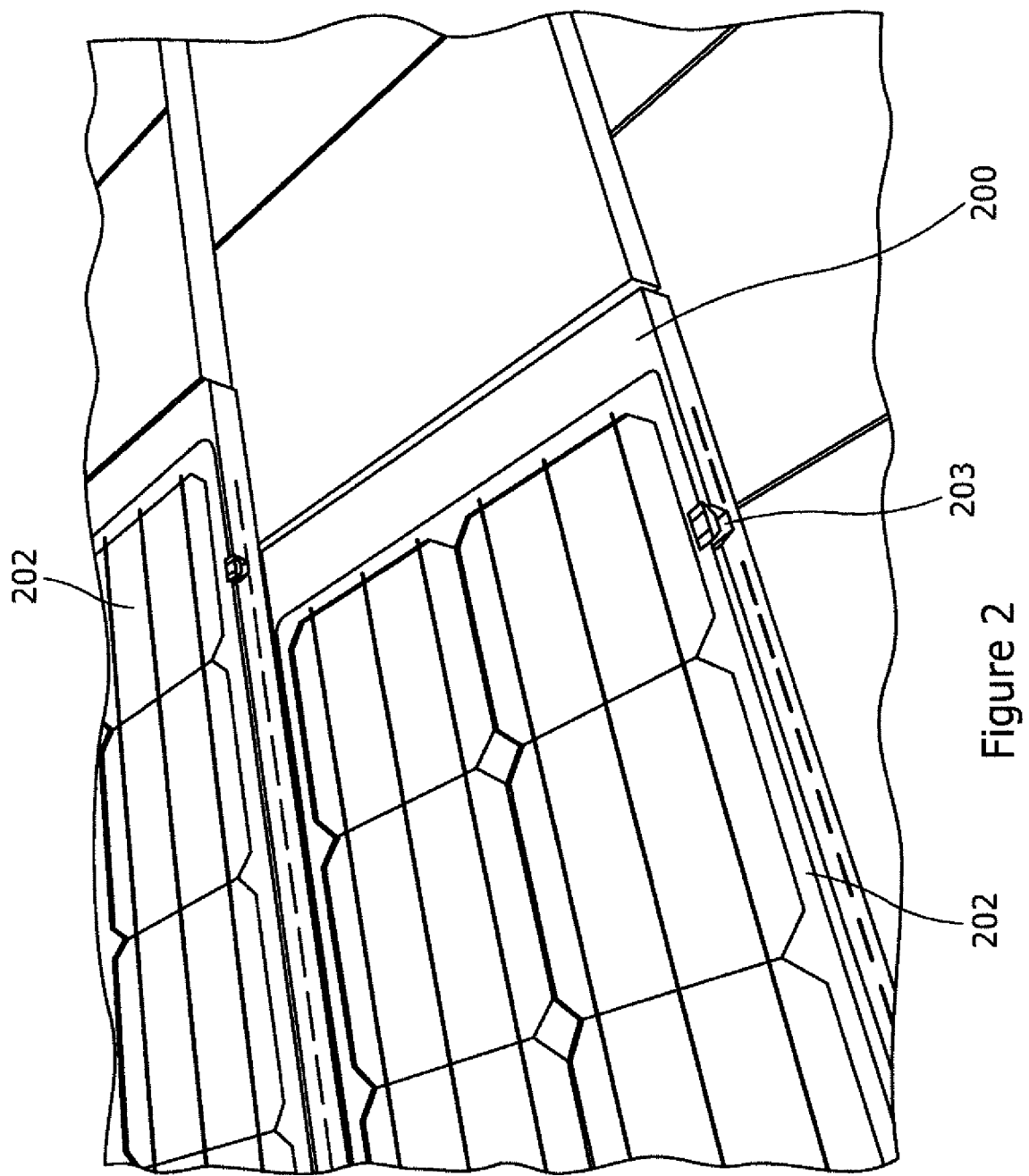
FIG. 2 shows schematically a detail of the known solar tile of FIG. 1 herein.
Figure 3:
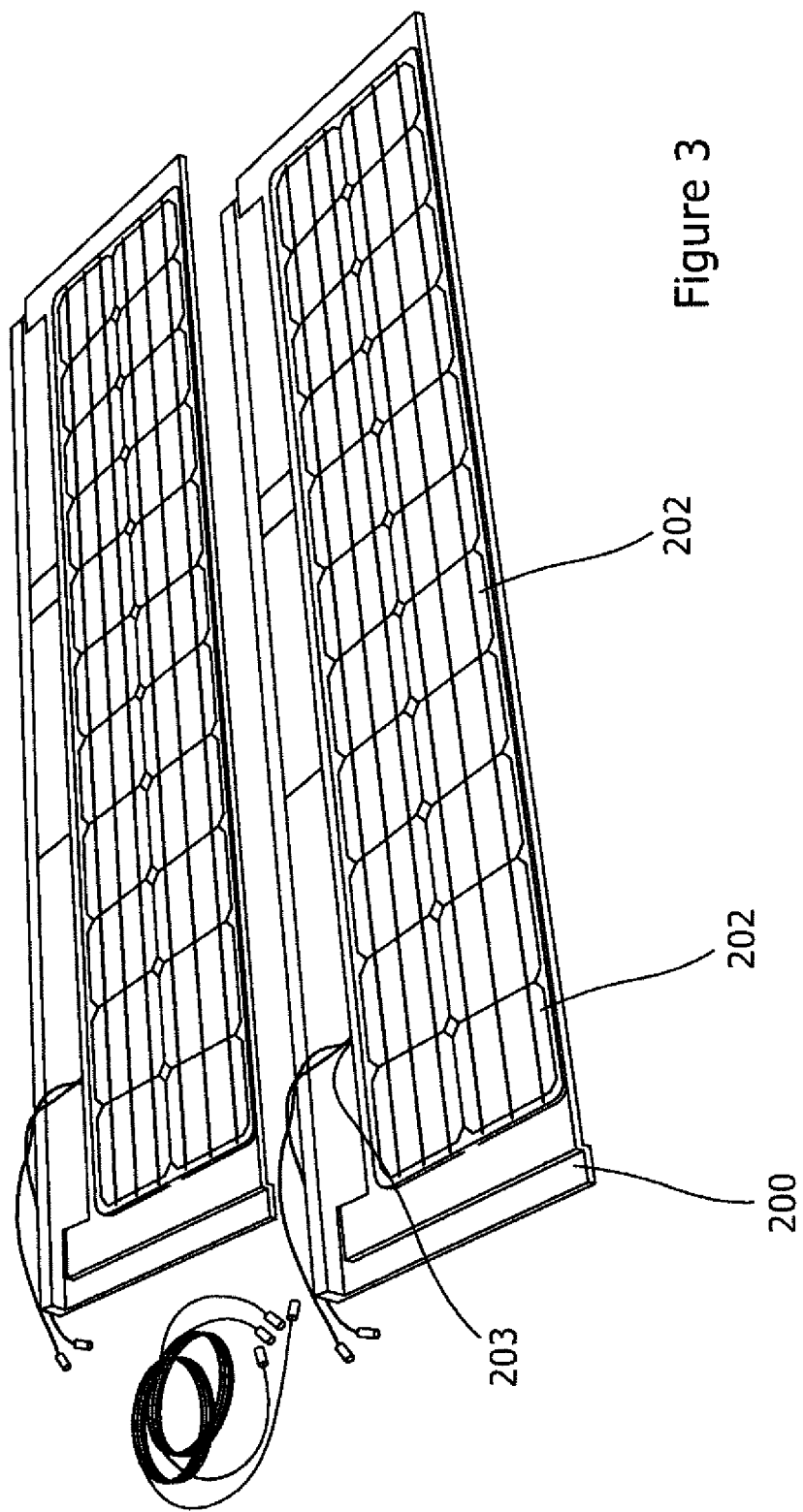
FIG. 3 shows schematically two known solar tiles prior to installation in a roof.
Figure 4:
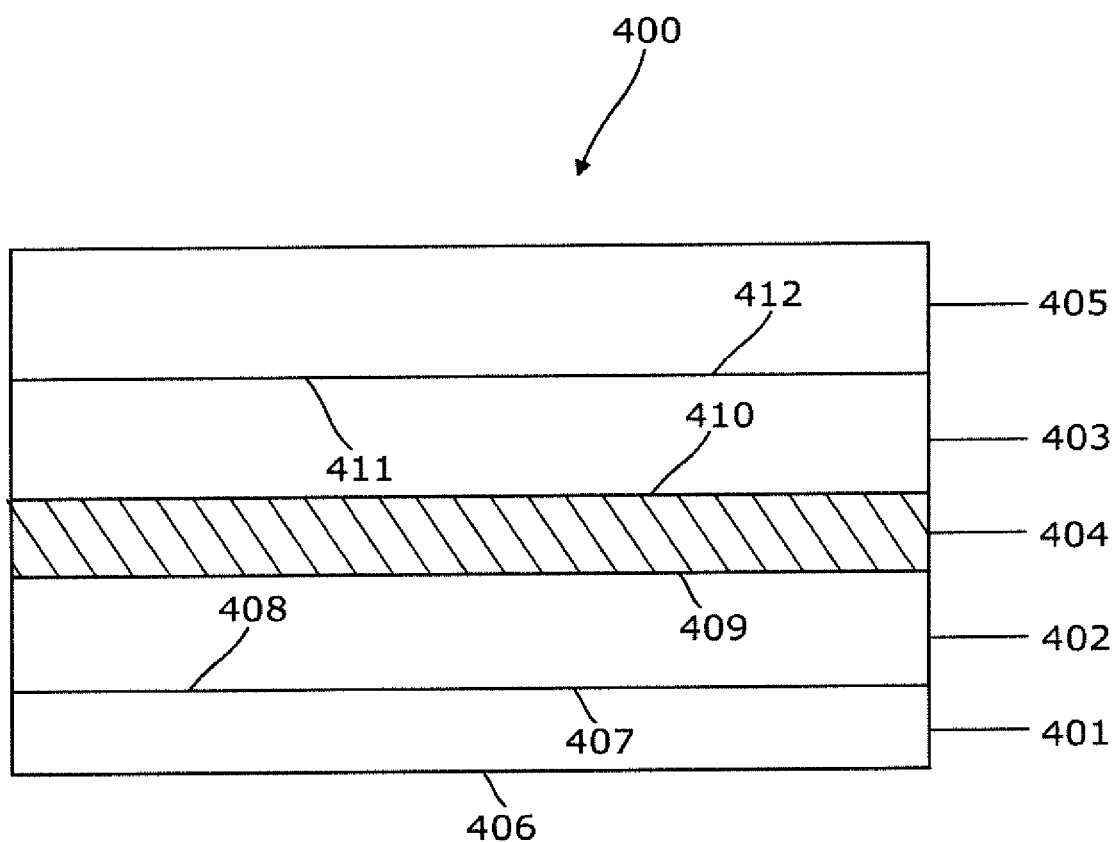
FIG. 4 is a schematic cut away view of a known photovoltaic solar panel.
Figure 5:
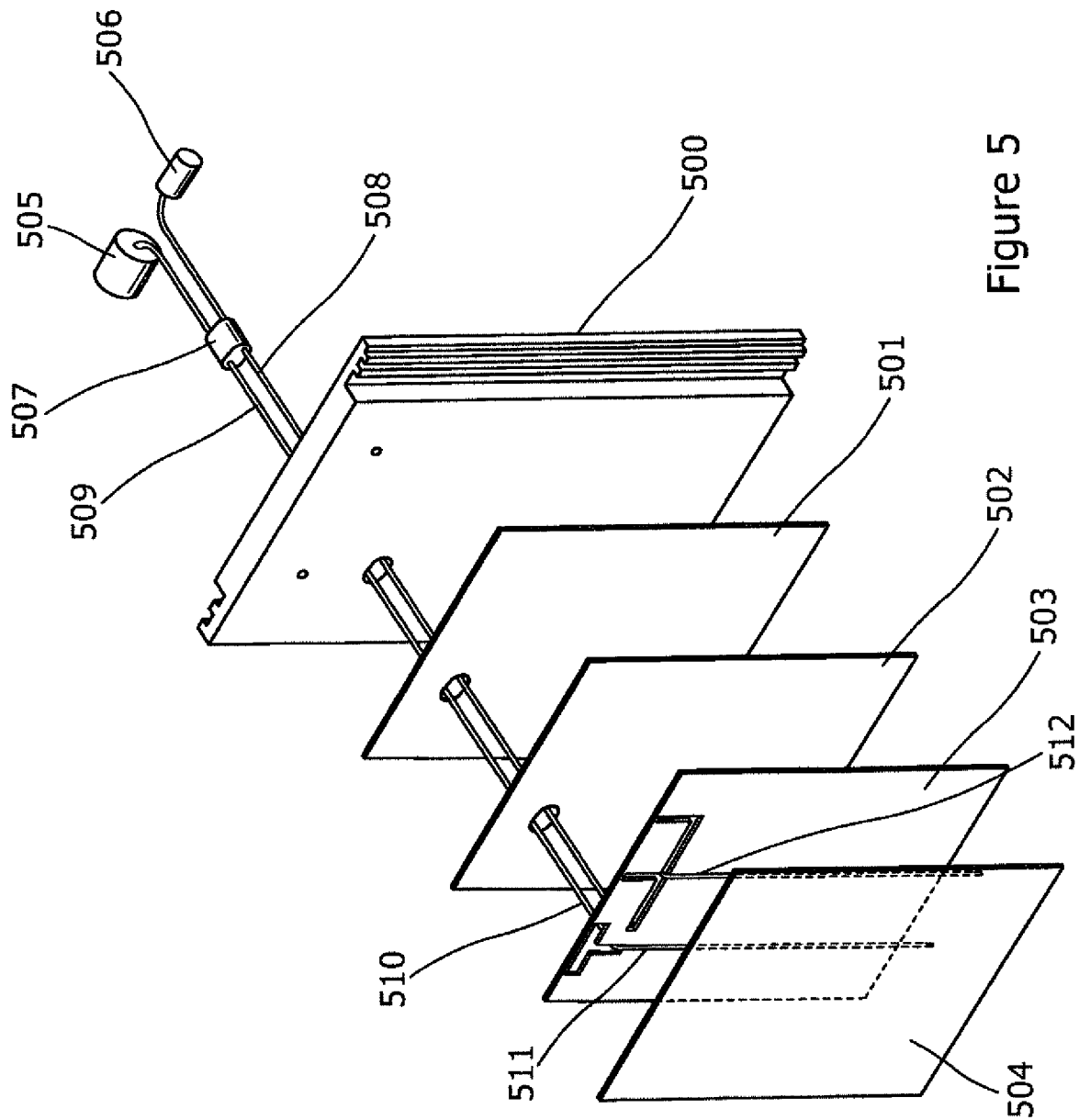
FIG. 5 illustrates schematically a first embodiment solar panel and roof tile in exploded view.

Referring to FIG. 5 herein, there is illustrated schematically in exploded view a first embodiment solar tile incorporating a novel solar panel.

The roof the comprises a roof tile 500, which can be a cement, plastics or metal roof tile. The solar panel comprises a silicone based adhesive sealant layer 501; a fiber glass back plate 502; a sheet 503 comprising a one or a plurality of monocrystalline or polycrystalline solar cells each comprising one or more solar wafers; and an ultra-violet transparent plastics cover sheet 504.

The one or more solar cells are sandwiched between the clear cover sheet 504, on the side of the wafer which is exposed to sun light, and the fiber glass back plate 502 at the rear side, which is adjacent the roof tile 500. The silicone based adhesive sealant layer 501 sticks a rear surface of the fiber glass back plate 502 to a front surface of the roof tile 500. The fibre glass back sheet gives rigidity and support to the sheet 503 which contains the solar cells.

The solar panel further comprises electrical connections which are accessible at the rear of the roof tile, for connecting the solar panel to an electrical circuit. The electrical connections comprise a negative connector 505; a positive connector 506; a silicone based seal 507, which fits into an aperture in the roof tile 500 and surrounds a pair of positive and negative conductors 508, 508 respectively such that the connectors are spaced apart, and protected from the weather and moisture; each electrical conductor 508, 500 comprising a copper wire surrounded with an insulating plastic sheath; a diode 510 connected to a positive output of the solar cells 503 and to positive conductor 509; and first and second aluminum strips 511, 512 which respectively form electrical connectors to the solar cells of the sheet 503, the aluminum strips each being covered with a respective strip of insulating electrical tape, the first strip 511 being connected to the positive conductor 509 via diode 510, and the second aluminum strip 512 being connected to the negative conductor 508.

The clear or transparent plastics cover sheet 504, the solar wafer sheet 503, along with first and second aluminum strip conductors 611, 512, and the fiber glass back plate 502 form a sealed laminated unit, which is sealed against the ingress of moisture.

Figure 6:
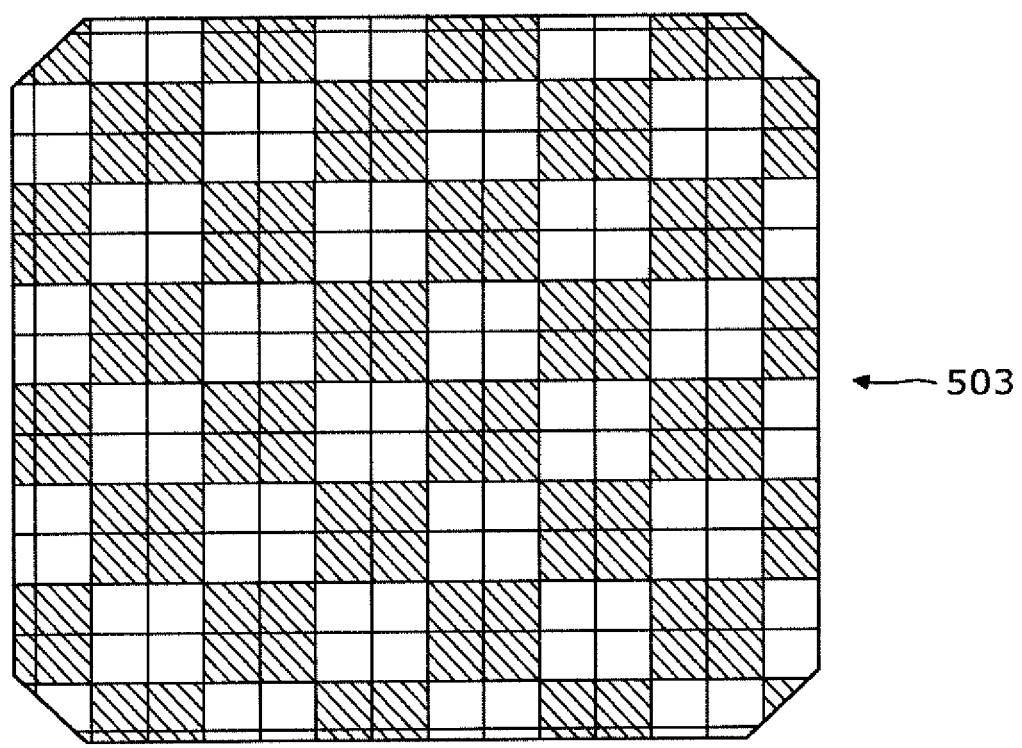
FIG. 6 illustrates schematically in view from the front, a solar panel comprising the first embodiment solar tile.

Referring to FIG. 6 herein, there is illustrated schematically in frontal view, an individual solar wafer. The solar wafer has general characteristics as follows:

In the example shown, a Monocrystalline P type boron doped silicone sheet has dimensions 156 mm height by 156 mm width. The Monocrystalline silicon wafer is grown by the CZ method. Electrical characteristics of the solar sheet are as follows:

| | Features |
|---|---|
| General Characteristics | |
| Resistivity | 1~3, 3~6 Ω.com |
| Oxygen Content | 1 × 10 18 atom/cm3 |
| Carbon Content | 1 × 10 17 atom/cm3 |
| Structural Characteristics | |
| Side | 156.0 mm ± 0.5 mm |
| Diameter | 200.0 mm ± 0.5 mm |
| Orientation | <100> |
| Thickness | 180 ± 20 μm 200 ± 20 μm |
| Mechanical Characteristics | |
| TTV | ≤40 μm |
| Bow | ≤70 μm |
| Surface | No microcrystalline structure |
| Saw Mark | ≤15 μm |

Whilst FIG. 6 shows a best mode embodiment monocrystalline silicon solar wafer, variations to the dimensions may be applied in other embodiments.

Figure 7:
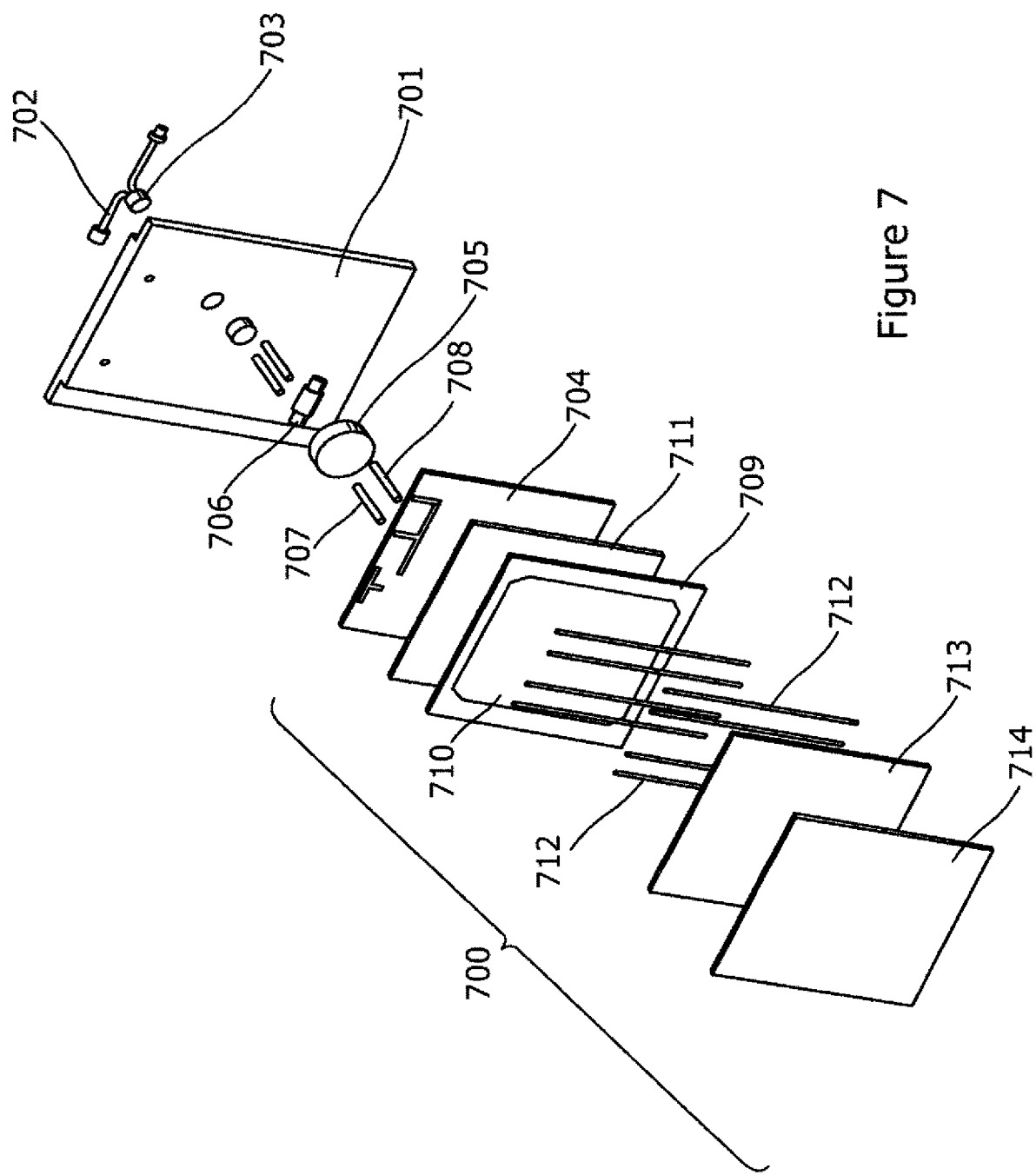
FIG. 7 is an exploded view of a second embodiment photovoltaic solar panel and roof tile.

Referring to FIG. 7 herein a second embodiment photovoltaic solar panel 700, designed to be attached to the front surface of a roof tile 701, comprises a male plug DC connector 702, inserted from the front side of the tile; a female plug 703 located in a hole drilled through said tile; a printed circuit board 704; a junction box 705, permanently sealed to the back of said circuit board; which houses a diode 706, which is connected to positive and neutral wires 707, 708, extending from the female plug 703; said wires are in turn connected to the circuitry of the circuit board 704.

A solar array 709 is provided and consists of a plurality of monocrystalline solar wafers 710 which are connected together in a bank of two rows.

The junction box is rated at 1000 dcV.

Each solar wafer 710 is situated on a layer of ethylene-vinyl acetate 711, which covers the surface of the printed circuit board 704.

Soldered aluminum strips 712 connect Individual solar cells 710; the ends of said strips are folded over the top of the cells 710 to attach them to the circuit board 704.

The aluminum strips are covered by a strip of electrical tape and a sheet of ethylene-vinyl acetate 713. A layer of ethylene tetrafluoroethylene 714 covers the ethylene-vinyl acetate 713.

The total layered array is bound via lamination at a temperature range of 150° C. to 200° C., a vacuum pressure of 2 to 4 atmospheres for a period of 10 to 15 minutes.

Figures 8, 9:
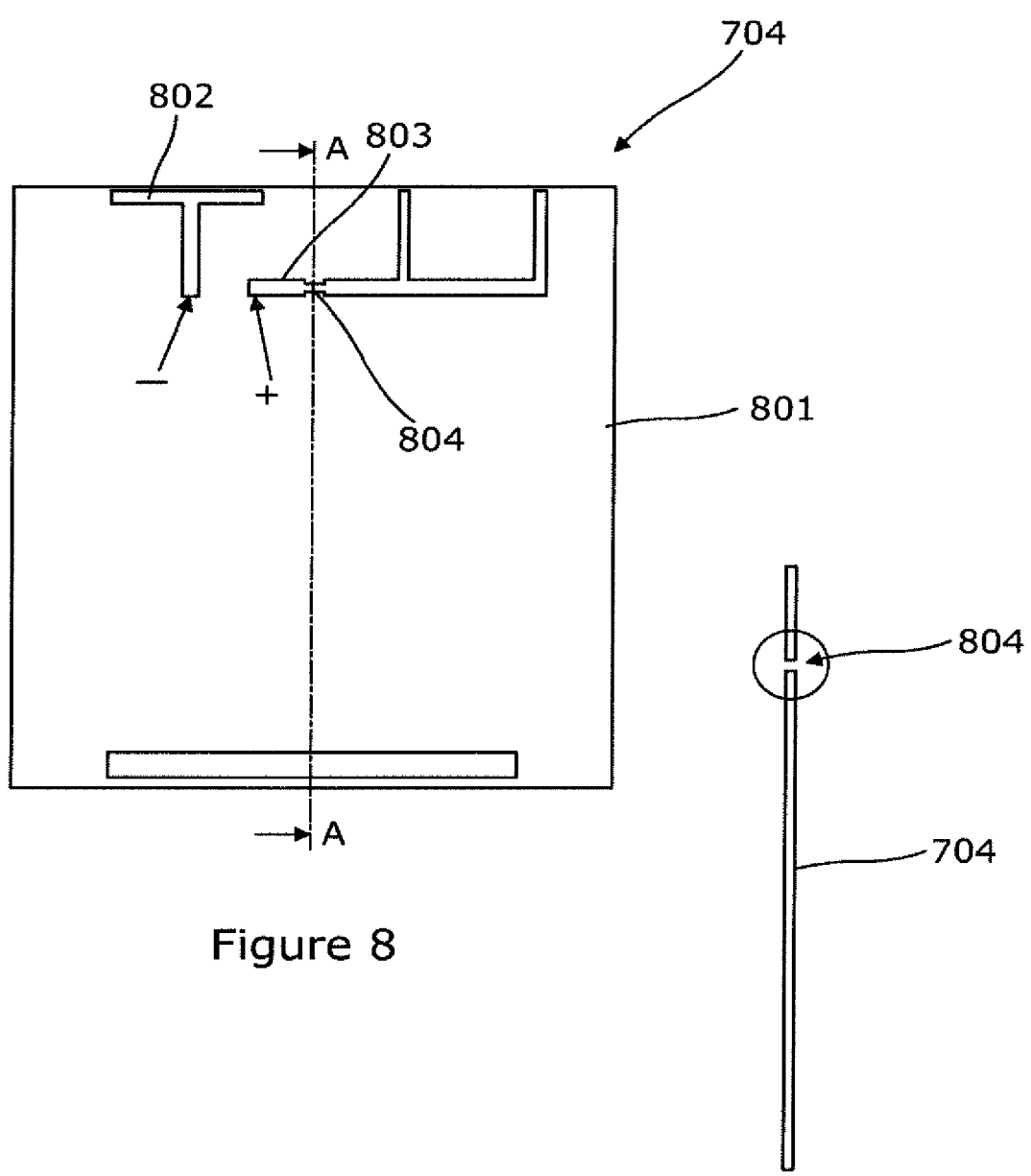
FIG. 8 is an enlarged view of a printed circuit board of the solar tile of FIG. 7 herein.
FIG. 9 is a perspective view of a cross-section taken along line 'A' in of the circuit board of FIG. 8.

Referring to FIG. 8 herein, the printed circuit board 704 comprises a substrate board 801, substantially rectangular in shape; negative and positive electrical conductive tracks 802, 803; and an aperture 804 which extends through the circuit board 704.

Referring to FIG. 9 there is shown a perspective view of a cross-section taken along line 'A' in FIG. 8, wherein the aperture through the circuit board 704 is visible.

Figure 10:
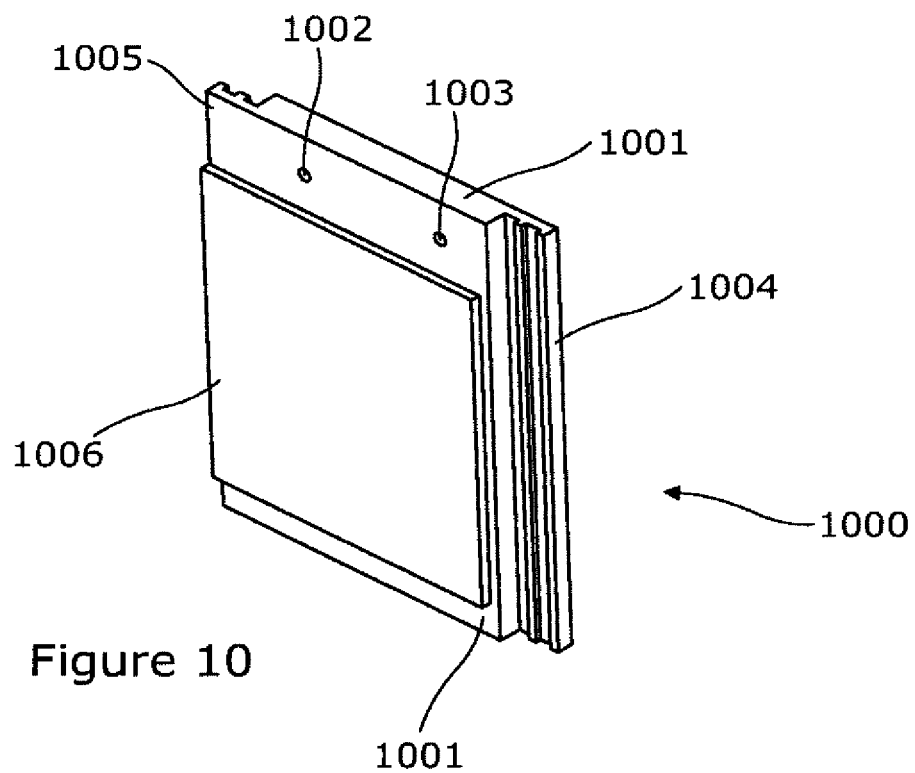
FIG. 10 is a perspective view of an improved solar roof tile incorporating a solar panel disclosed herein.

Referring to FIG. 10 herein there is shown a perspective view of a third embodiment improved solar roof tile and solar panel 1000, comprising a substantially rectangular, flat roof tile 1001, with first and second through tile apertures 1002, 1003, equidistant from a perimeter of the tile, and grooves 1004, 1005 on the extreme edges of the tile to enable attachment of the tile to a roof; and a substantially rectangular photovoltaic solar panel 1006, fixed to a front face of the roof tile the solar panel having area dimensions smaller than the area dimensions of a front face of the roof tile.

Figure 11:
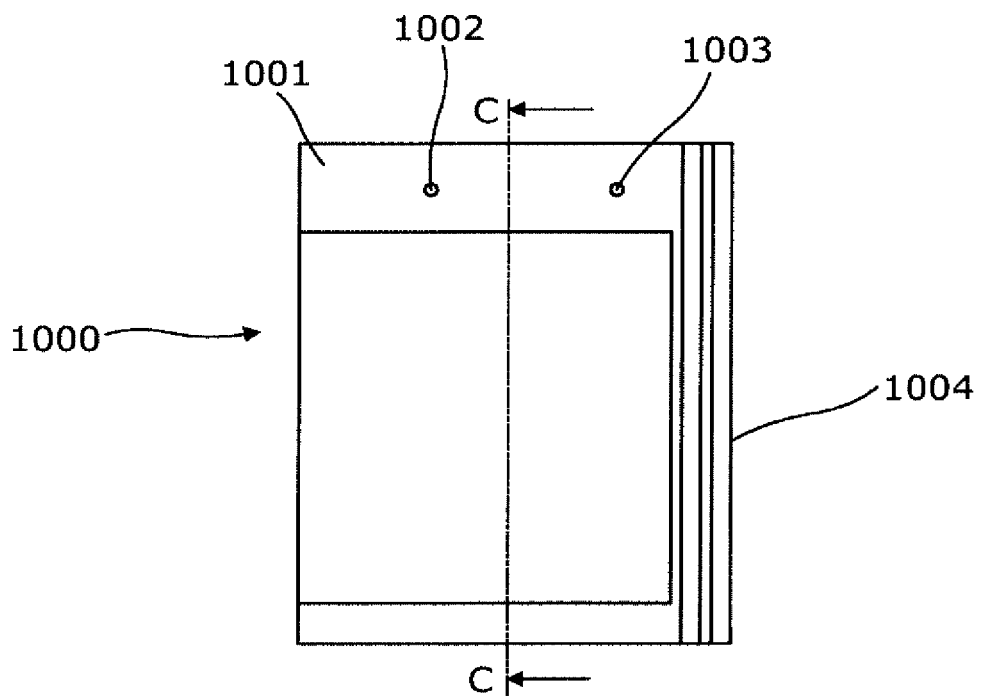
FIG. 11 is a plan view of the improved solar roof tile of FIG. 10 herein.

FIG. 11 is a plan view of an improved solar roof tile and panel 1000, shown in FIG. 10 herein, comprising a substantially rectangular, flat roof tile 1001, with through tile apertures 1002, 1003, equidistant from the perimeter of the tile and grooves on the extreme edges of the tile 1004 to enable attachment of the tile to a roof; and a substantially rectangular photovoltaic solar panel 1004, which is smaller than the dimensions of the roof tile.

Figure 12:
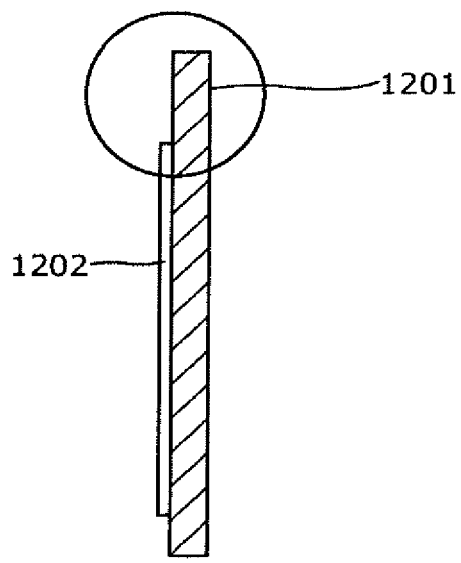
FIG. 12 is a cross-section along plane 'C' of FIG. 11.

Referring to FIG. 12 herein, there is shown a cross-section along plane 'C' of FIG. 11 in which the height of the roof tile 1001 extends beyond the height of the photovoltaic solar panel 1006, and in which the circle annotation denotes that the degree of overlap between the tile and the photovoltaic solar panel is variable and determined by the manufacturer.

Figure 13:
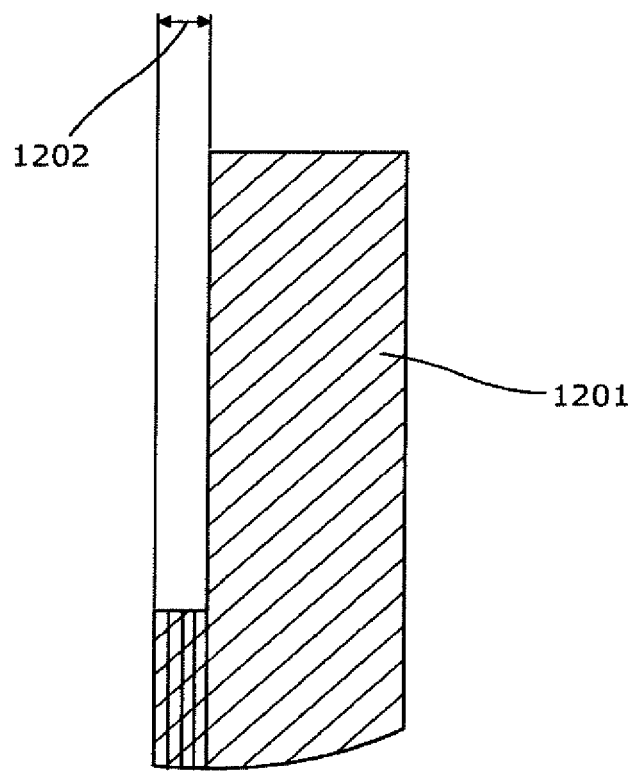
FIG. 13 is a close up view of one end of FIG. 12 herein.

Referring to FIG. 13 herein, in close up detail part of the cross section of FIG. 12, showing the laminate structure of the solar panel affixed to the front of the roof tile.

Figure 14:
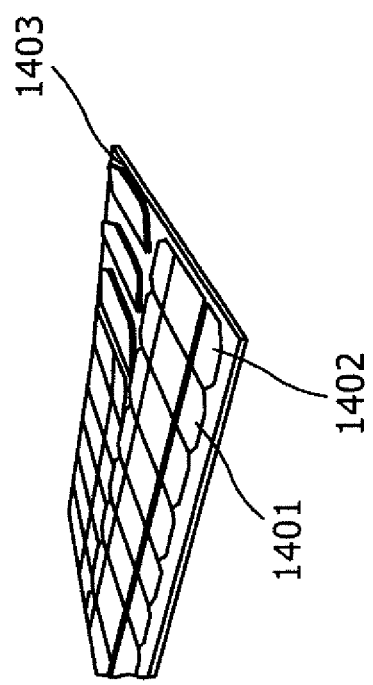
FIG. 14 is an illustration of one stage of a photovoltaic solar panel manufacturing process.

Referring to FIG. 14 herein, there is Illustrated a view of one stage of a manufacturing process for making a solar panel and roof tile as described herein, in which a plurality of mono crystalline solar wafers 1401 are arranged on a circuit board 1402, on a layer of ethylene-vinyl acetate and are connected together by soldered aluminum wires 1402, in a bank of two rows. The soldered aluminum wires 1402 are covered by strips of electrical tape.

Figure 15:
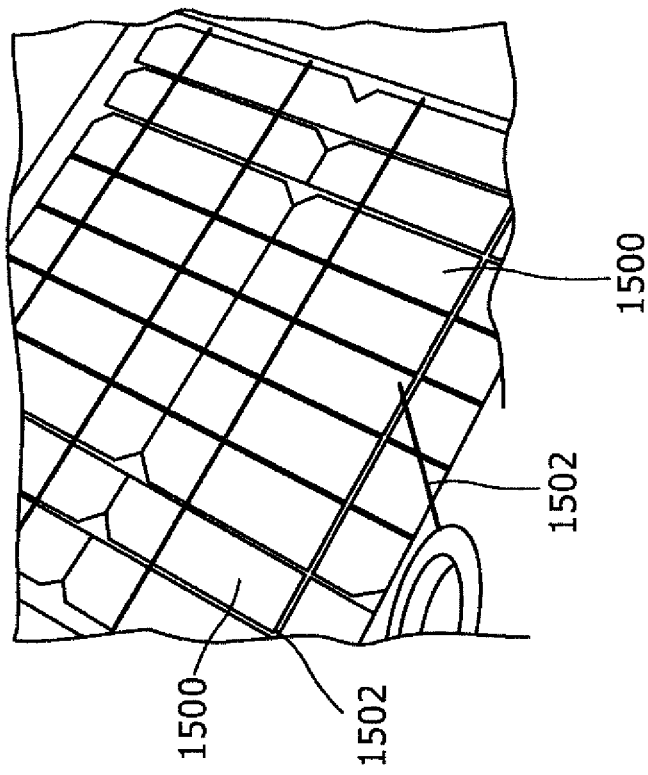
FIG. 15 is an illustration of another stage of manufacture of the photovoltaic solar panel.

Referring to FIG. 15 herein, there is Illustrated another manufacturing stage for manufacture of a solar panel as described herein. Each of a plurality of solar wafers 1500 in a row are connected together with an aluminum strip electrical connector 1501. The aluminum strip connector is covered with a strip of black electrically insulating and protective tape 1502.

Figure 18:
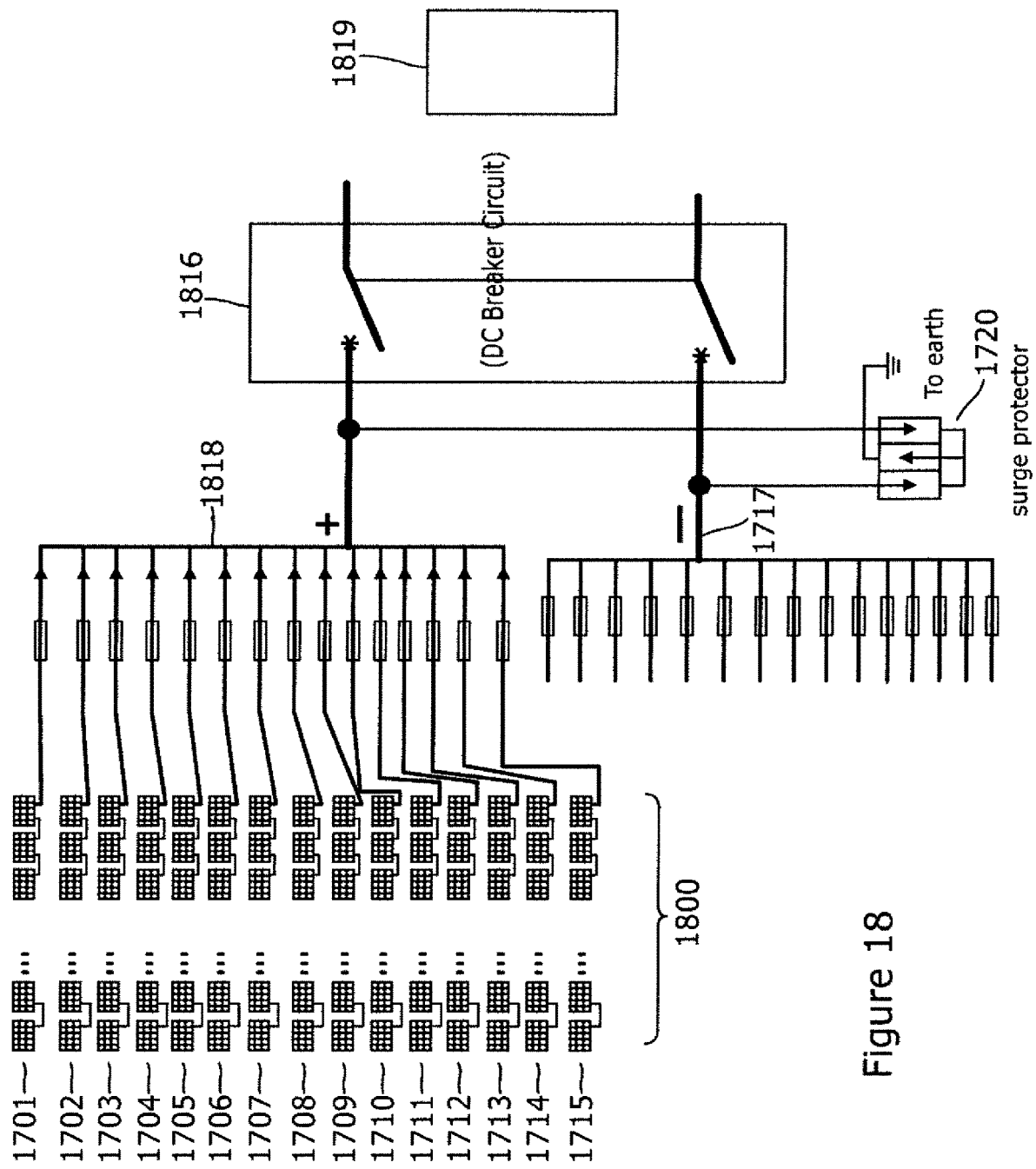
FIG. 18 illustrates schematically circuit diagram for connecting a plurality of solar roof tiles as described herein before in a solar roof panel Installation.

Referring to FIG. 18 herein, there is illustrated schematically an individual solar wafer, having first and second electrical conductors 1601, 1602.

Figure 16:
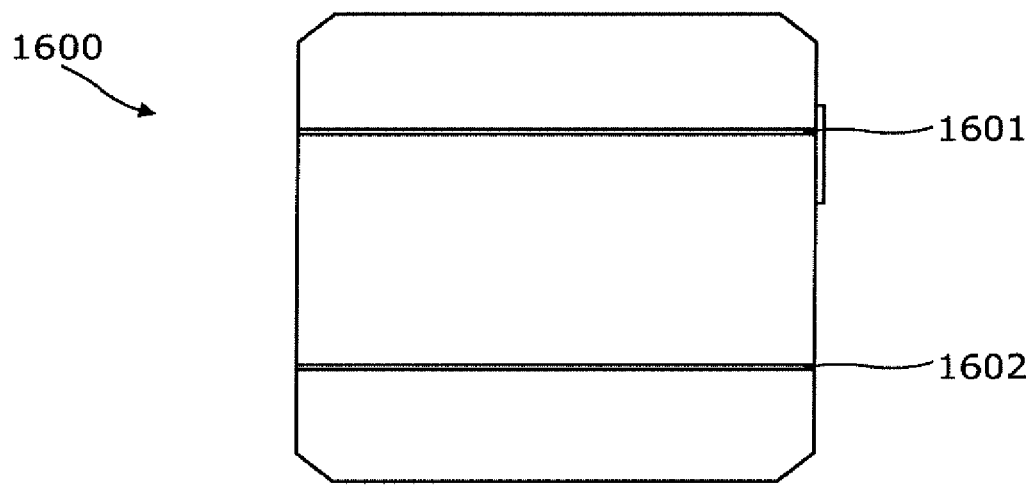
FIG. 16 illustrates schematically in view from the front, a solar cell comprising a solar panel described herein.
Figure 17:
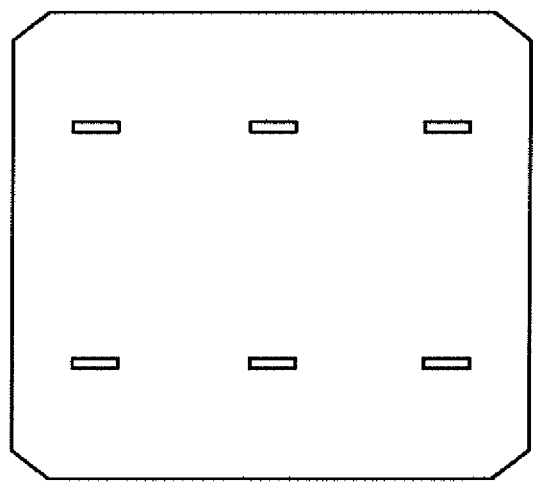
FIG. 17 illustrates schematically the solar cell of FIG. 16 in view from the rear.

Referring to FIG. 17 herein, there is illustrated schematically the reverse side of the solar wafer shown in FIG. 16.

Referring to FIG. 18 herein, there is illustrated schematically a wiring diagram for connection of a plurality of individual solar roof panels in a solar roof tile installation.

An array of individual solar roof panels 1800 are arranged in rows and columns on a roof. Each individual solar panel has a positive conductor and a negative conductor as shown in FIGS. 5, 7 and 8 herein, with a diode on the positive conductor, so that when a negative conductor of a first solar panel is connected to a positive conductor of a second solar panel in a serial chain, there is a single one-way D.C. electrical path flowing through a chain of solar cells in series. The plurality of semi-conductor diodes ensure that current can flow in only one director through the chain of serially linked solar panels.

In FIG. 18, there are shown individual chains of solar panels 1801 to 1815. A respective positive terminal of each chain of solar panels are connected together to form a positive bus 1816, and similarly, a respective negative terminal of each chain of solar panels are connected together to form a negative bus 1817. The positive and negative buses supply current, via a direct current circuit breaker 1818, to an AC inverter, which converts the direct current output of the solar cells into a single phase alternating current electrical output. There is provided a surge protector 1820 which connects to earth, so that in the event of a high voltage or current spike experienced on the negative buses, these are grounded to earth. This provides protection from current and/or voltage surges during for example an electrical storm.

Conventional roof tile dimensions from different manufacturers vary. The height and width of the solar panel embodiments disclosed herein may be selected to match the size of roof tile. A minimum length and width of each panel is calculated to produce a minimum of 10 Watts each at peak sunlight, and is dependent on the available area of the roof tile. Most known roof tile areas will achieve this minimum power output. Larger sized roof tiles allow the solar cell 50 area to be Increased, achieving a greater power output.

Each solar panel contains a diode on the positive circuit of its printed circuit board. Each solar tile is fitted to a roof using a known roofing method. The solar tiles are wired together in series to form a solar array. The solar array is connected through a combiner box and to an inverter.

The output of the solar array is dependent on the D.C. voltage range demanded by the inverter. The voltage is controlled by limiting the number of solar tiles wired in series. Each series or row of solar tiles has two final contact wires which are combined together through a suitable fuse to a positive and negative bus bar to form a parallel circuit with one positive and one negative output. These outputs are wired to an inverter.

Each solar cell within the solar panel is protected by an electrical diode within the series circuitry to minimize the effect of "shadowing" for example as the incident light on the solar cells vary due to cloud movements. If one solar cell is shadowed, its performance is reduced without affecting the performance of any adjacent solar cell. Similarly, if one solar panel is shaded by for example a tree, then its performance may be reduced compared to an adjacent solar panel which is in full sunlight. Due to the serial diodes, the shading of one solar cell does not affect the performance of adjacent solar cells.

The embodiments disclosed herein can be fitted to new or replacement roofs. Any individual failed solar panel is easily replaceable by a new solar roof tile.

The invention claimed is:

1. A photovoltaic solar roof tile assembly comprising:
    a roof tile having a front side and a rear side and a hole extending through the tile;
    a circuit board having a front side and a rear side, the rear side of the circuit board facing the front side of the roof tile,
    a photovoltaic solar panel having a front side and a rear side, the rear side of the photovoltaic solar panel facing the front side of the circuit board,
    a junction located in the hole extending through the tile, wherein the junction comprises a first DC connector and a second DC connector, a female plug located in the hole in the roof tile, the female plug including a positive conductor and a negative conductor extending from both a first end and second end of the female plug, the positive and negative conductors extending from the first end comprising the second DC connector, wherein the first DC connector further comprises a positive conductor and a negative conductor, the positive conductor electrically connected to the positive output of the photovoltaic solar panel and the negative conductor electrically connected to the negative output of the photovoltaic solar panel, and wherein the positive conductor of the first DC connector is electrically connected to the positive conductor of the second DC connector extending from the first end of the female plug and the negative conductor of the first DC connector is electrically connected to the negative conductor extending from the first end of the second DC connector, the positive conductor and negative conductor extending from the second end of the female plug for connection to an electrical circuit, wherein the photovoltaic solar panel, circuit board and the first DC connector form a laminated structure, with the first DC connector sealed to the laminated structure, the first DC connector being accessible from the rear side of the roof tile and attachable and detachable from the second DC connector, and wherein one of the first DC connector and second DC connector include a diode.

2. The photovoltaic solar roof tile assembly of claim 1, the laminated structure further comprising a back plate.

3. The photovoltaic solar roof tile assembly of claim 1, wherein the junction is rated at 1,000 dcV.

4. The photovoltaic solar roof tile assembly of claim 1, wherein the roof tile comprises at least one of concrete and clay.

5. The photovoltaic solar roof tile assembly of claim 1, wherein the roof tile comprises at least one of metal and plastic.

6. The photovoltaic solar roof tile assembly of claim 1, wherein the first DC connector is a male DC connector and the second DC connector is a female DC connector.

* * * * *